United States Patent
Aman

(10) Patent No.: US 6,876,236 B2
(45) Date of Patent: Apr. 5, 2005

(54) CLOCK MULTIPLIER CIRCUIT

(75) Inventor: Norihisa Aman, Kawasaki (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/624,904

(22) Filed: Jul. 23, 2003

(65) Prior Publication Data

US 2004/0135601 A1 Jul. 15, 2004

(30) Foreign Application Priority Data

Jul. 23, 2002 (JP) ..................................... P.2002-214268

(51) Int. Cl.[7] ............................................. H03B 19/00
(52) U.S. Cl. ........................ 327/121; 327/116; 327/119; 377/47
(58) Field of Search ................................ 327/116, 119, 327/121, 122, 141, 142, 152, 154, 155, 160, 162, 165, 166, 105, 113, 114; 377/47

(56) References Cited

U.S. PATENT DOCUMENTS

| | | | | |
|---|---|---|---|---|
| 5,038,117 A | * | 8/1991 | Miller | 331/16 |
| 5,561,692 A | * | 10/1996 | Maitland et al. | 375/371 |
| 5,592,515 A | * | 1/1997 | Saban et al. | 375/340 |
| 5,719,510 A | * | 2/1998 | Weidner | 327/119 |
| 5,786,715 A | * | 7/1998 | Halepete | 327/116 |
| 5,789,985 A | * | 8/1998 | Yamauchi et al. | 331/1 A |
| 5,815,043 A | * | 9/1998 | Chow et al. | 331/57 |
| 5,854,576 A | * | 12/1998 | Swan | 331/57 |
| 5,854,755 A | | 12/1998 | Park et al. | |
| 6,020,771 A | * | 2/2000 | Conesa Lareo | 327/119 |
| 6,107,846 A | | 8/2000 | Shinmori | |
| 6,130,566 A | * | 10/2000 | Yokomizo | 327/175 |
| 6,329,850 B1 | * | 12/2001 | Mair et al. | 327/107 |
| 6,346,833 B1 | * | 2/2002 | Kuroki | 327/119 |
| 6,351,756 B1 | * | 2/2002 | Taniyoshi | 708/103 |
| 6,509,800 B2 | * | 1/2003 | Stockton | 331/11 |
| 6,600,912 B1 | * | 7/2003 | Stepp et al. | 455/313 |

FOREIGN PATENT DOCUMENTS

JP      6-188898      7/1994

* cited by examiner

Primary Examiner—Timothy P. Callahan
Assistant Examiner—Hai L. Nguyen
(74) Attorney, Agent, or Firm—McDermott Will & Emery LLP

(57) ABSTRACT

A clock multiplier circuit which generates a multiple clock having a stable frequency from a reference clock without using analog devices. The clock multiplier circuit includes ring oscillator which oscillates at a higher frequency than that of the multiple clock; a reference clock counter for counting the sampling output of the reference clock by the output clock of the ring oscillator to obtain a count value of the half cycle of the reference clock; and a multiple clock counter which, in case the value obtained by dividing the count value of the half cycle of the obtained reference clock by the multiplication factor externally given is defined as a multiple count value, inverts the multiple clock output each time it counts the multiple count value by the output clock of the ring oscillator.

4 Claims, 5 Drawing Sheets

CLOCK MULTIPLIER CIRCUIT

BACKGROUND OF THE INVENTION

1. Field of the Invention

The present invention relates to a clock multiplier circuit for generating a clock whose frequency is a multiple of a reference clock.

2. Description of the Related Art

In the related art, a PLL (Phase-locked Loop) incorporating a VCO (Voltage-controlled Oscillator) has been used to obtain a clock signal whose frequency is a multiple of a reference clock. FIG. 5 is a block diagram showing the configuration of such a conventional clock multiplier circuit using PLL.

In FIG. 5, a numeral 501 represents a reference clock, 502 a multiple clock output, 511 a phase comparator, 512 a charge pump, 513 a low pass filter, 514 a VCO, 515 a frequency divider, and 516 a waveform shaping circuit.

The reference clock 501 input to the phase comparator 511 is compared with the output of the frequency divider which divides the output of the VCO 514 by N. A control voltage generated by the charge pump 512 and the low pass filter 513 from the phase difference output is supplied to the VCO 514. The control voltage controls the VCO 514 set to oscillate a frequency N times the reference clock 510 for loop control by the PLL. The waveform shaping circuit 516 performs waveform shaping so that the duty cycle of the output waveform of the VCO 514 will be ½.

However, the conventional clock multiplier circuit has two major problems. The first problem is that the low pass filter requires a large time constant in order to stabilize a desired multiple frequency in the conventional clock multiplier circuit. When the low pass filter is built into an LSI, a greater value of a resistor or capacitor as analog devices is required. Due to an increase in the chip size caused by an increase in the footprint of the analog devices or variation in the resistors or capacitors, the PLL could oscillate a signal without locking the phase.

The second problem is that a lock-up time is required to obtain a stable oscillating frequency. FIG. 6 shows the transition in the output frequency of a conventional clock multiplier circuit using a PLL at the start of operation of the output frequency. As shown in FIG. 6, a clock multiplier circuit using a conventional PLL is accompanied by waste of operation time and current consumption before a stable oscillating frequency is obtained.

SUMMARY OF THE INVENTION

The invention has been proposed in view of the aforementioned circumstances and aims at providing a clock multiplier circuit for generating a clock obtained by multiplying the frequency of a reference clock without using analog devices required by a PLL, in order to obtain a stable frequency.

In order to solve the problems, a clock multiplier circuit according to a first aspect of the invention is a clock multiplier circuit which outputs a multiple clock having a frequency of a multiplication factor externally given with regard to a reference clock, characterized by comprising: a ring oscillator which oscillates at a sufficiently higher frequency than that of the multiple clock; a reference clock counter for counting the sampling output of the reference clock by the output clock of the ring oscillator to obtain the count value of the half cycle of the reference clock; and a multiple clock counter which, in case the value obtained by dividing the count value of the half cycle of the obtained reference clock by the multiplication factor is defined as a multiple count value, inverts the output of the multiple clock output each time it counts the multiple count value by the output clock of the ring oscillator.

With this configuration, by eliminating analog devices and generating a multiple clock in a circuit which counts a multiple count value, a clock multiplier circuit without a feedback loop is provided, thereby obtaining an output free from a transient response observed in a PLL.

A multiple clock is generated by obtaining the count value of the half cycle of the reference clock from the output clock of a free-run ring oscillator, and counting the multiple count value from the output clock of the free-run ring oscillator. Thus, even in case the oscillating frequency of the ring oscillator varies due to a variation in the source voltage or temperature, correction according to the variation is automatically performed.

A clock multiplier circuit according to a second aspect of the invention is a clock multiplier circuit according to the first aspect, characterized in that the ring oscillator comprises an odd number of inverter stages.

With this configuration, the ring oscillator comprises an odd number of stages so that it is not necessary to use the oscillating frequency control voltage range (dynamic range) required in case a VCO issued. This readily reduces the voltage of the circuit.

A clock multiplier circuit according to a third aspect of the invention is a clock multiplier circuit according to the first or second aspect, characterized in that the multiple clock counter starts counting of a multiple count value in synchronization with the inversion per half cycle of the reference clock.

With this configuration, counting to generate a multiple clock is started in synchronization with the inversion per half cycle of the reference clock. Thus it is possible to align the phase of the multiple clock with that of the reference clock without using a phase comparator.

A clock multiplier circuit according to a fourth aspect of the invention is a clock multiplier circuit according any one of the first through third aspects, the clock multiplier circuit further comprising an unlock detection circuit, characterized in that the multiple clock counter generates a count end pulse each time it counts the multiple count value and that the unlock detection circuit determines detection of an unlock in case the count end pulse is not detected within a cycle of the reference clock and restarts the ring oscillator based on determination of the detection of unlock.

With this configuration, by determining detection of an unlock in case a count end pulse is not detected within a cycle of the reference clock, it is possible to detect a case where a multiple clock is not obtained because the ring oscillator is shut down. By restarting the ring oscillator based on the determination of detection of an unlock, it is possible to automatically reset the operation of the clock multiplier circuit.

DESCRIPTION OF THE PREFERRED EMBODIMENT

Figure 1:
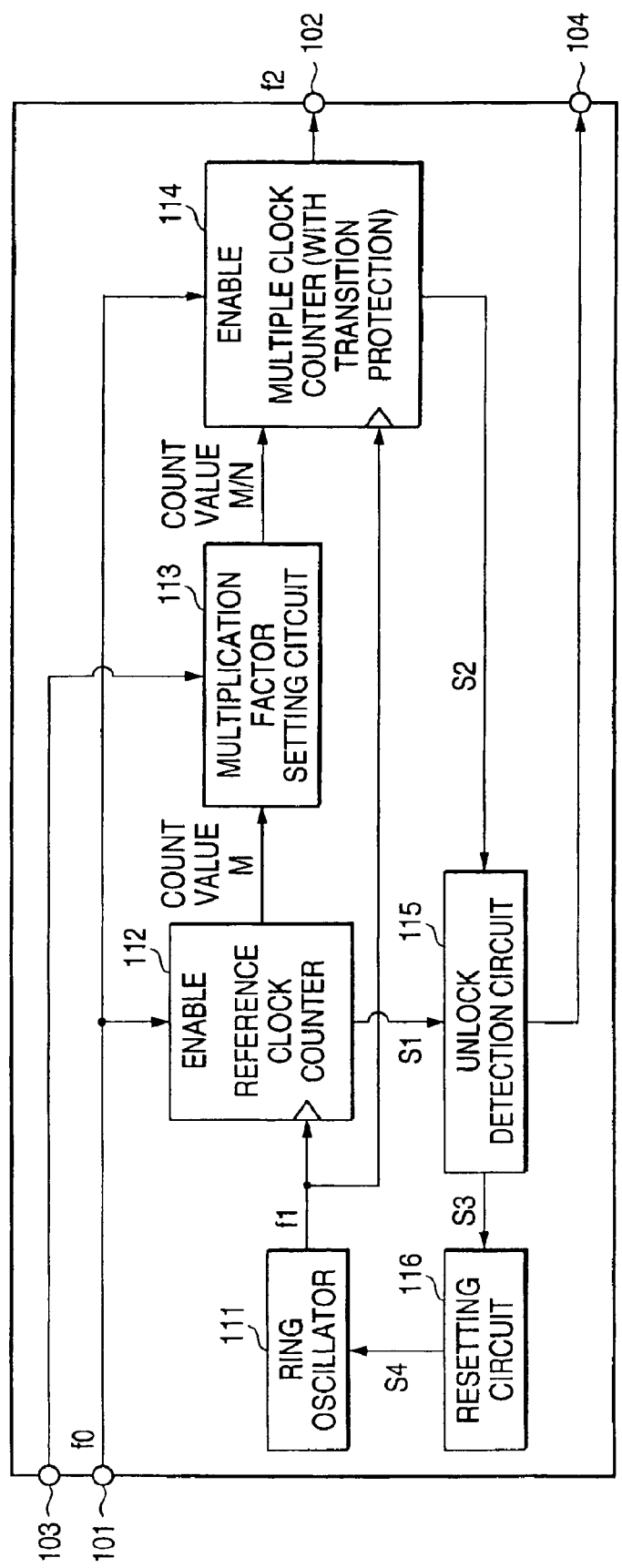
FIG. 1 is a block diagram showing a configuration of a clock multiplier circuit according to an embodiment of the invention.

An embodiment of the invention will be described referring to the drawings.

FIG. 1 is a block diagram showing a configuration of a clock multiplier circuit according to an embodiment of the invention. In FIG. 1, a numeral 101 represents a reference clock, 102 a multiple clock output, 103 a multiplication factor input, 104 an unlock detection output, 111 a ring oscillator, 112 a reference clock counter, 113 a multiplication factor setting circuit, 114 a multiple clock counter, 115 an unlock detection circuit, and 116 a resetting circuit.

Figure 2:
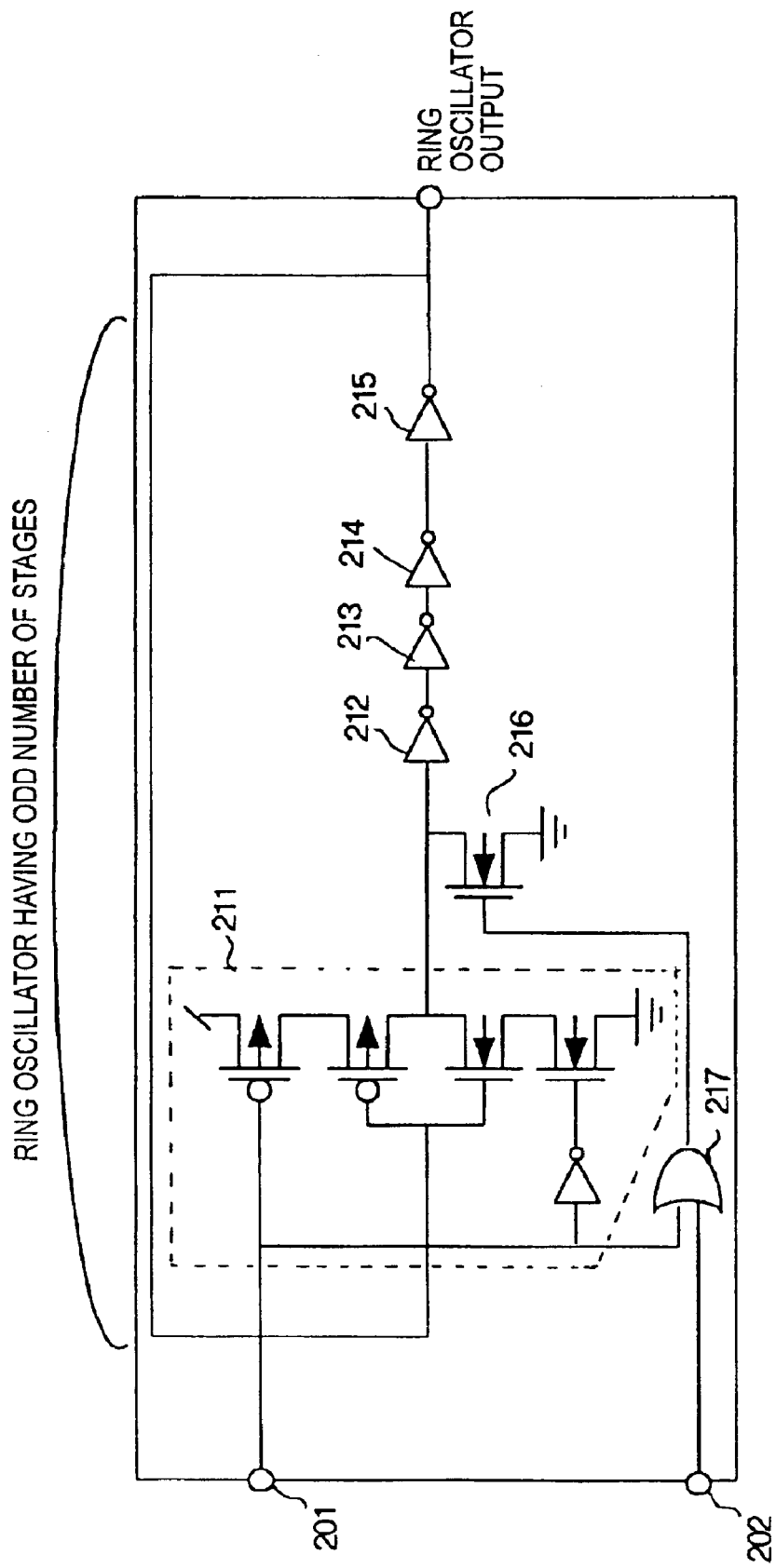
FIG. 2 is a circuit diagram showing an example of configuration of a ring oscillator to which an odd number of inverter stages are connected.

The ring oscillator 111 is a circuit oscillating a clock having a frequency sufficiently higher than a reference clock and a multiple clock. The ring oscillator 111 does not require a high accuracy so that it is implemented easily by connecting an odd number of inverter stages. FIG. 2 is a circuit diagram showing an example of configuration of a ring oscillator to which an odd number of inverter stages are connected. In FIG. 2, a numeral 201 represents a reset signal, 202 a reset pulse S4, 211 and 212 through 215 inverter stages, 216 a start pulse application circuit and 217 an OR circuit.

Figure 3:
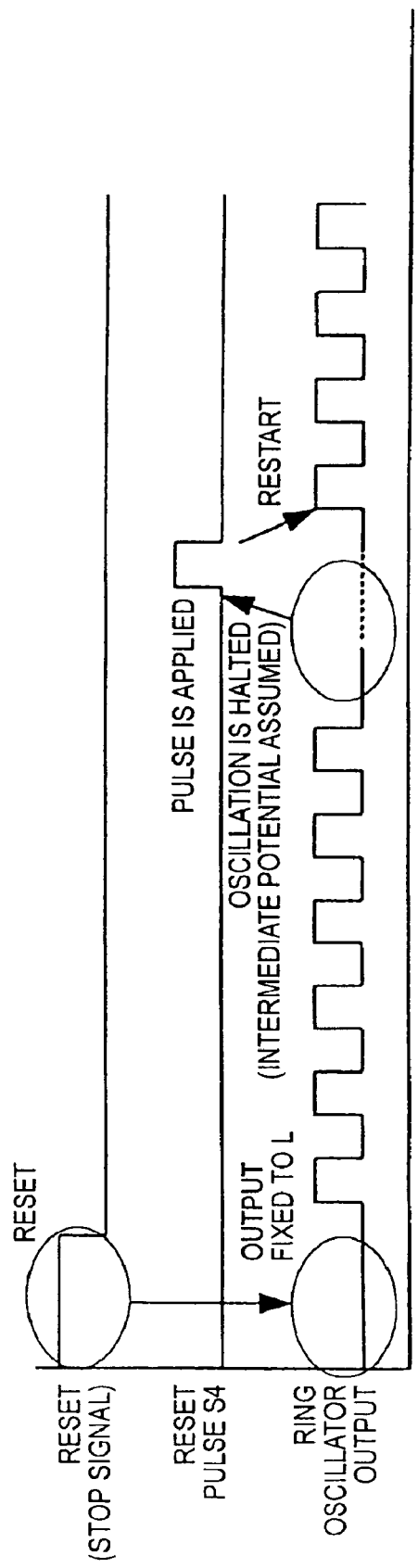
FIG. 3 is a timing chart illustrating the operation of the ring oscillator to which an odd number of inverter stages are connected.

FIG. 3 is a timing chart illustrating the operation of the ring oscillator 111 shown in FIG. 2. As shown in FIG. 3, the output of the inverter 211 is fixed to low so that the operation of the ring oscillator is halted while the reset signal is being input.

When the reset signal 201 is driven Low, the ring oscillator 111 starts its op ration at an oscillating frequency determined by the delay time of an odd number of inverter stages. In the event of a halt of oscillation assumed in case the input/output of the odd number of inverter stages has reached an intermediate potential, the return pulse S4 is applied to the start pulse application circuit 216 via the OR circuit 217 to restart the ring oscillator 111.

Figure 4:
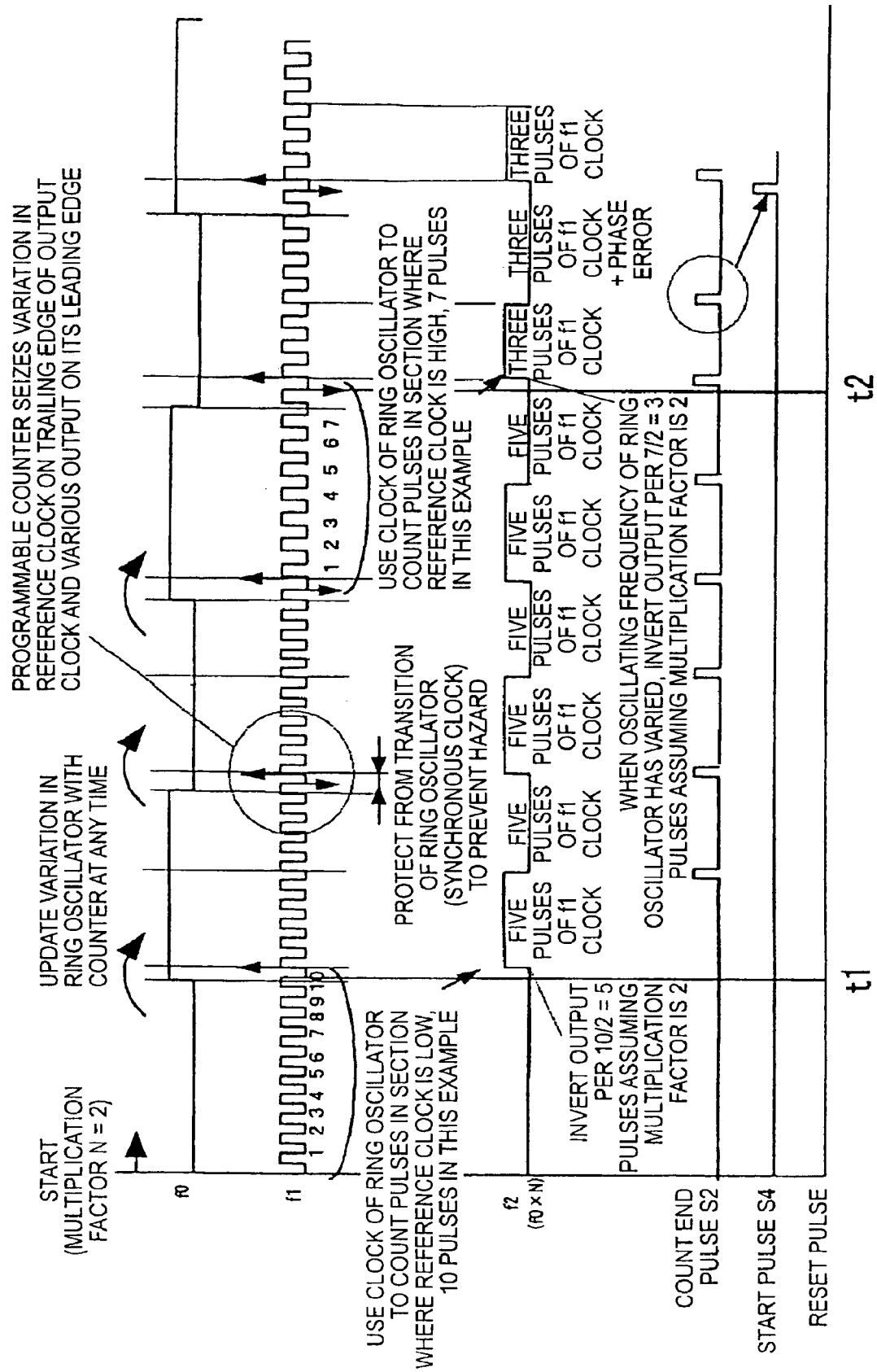
FIG. 4 is a timing chart illustrating the operation of the clock multiplier circuit according to an embodiment of the invention.
Figure 5:
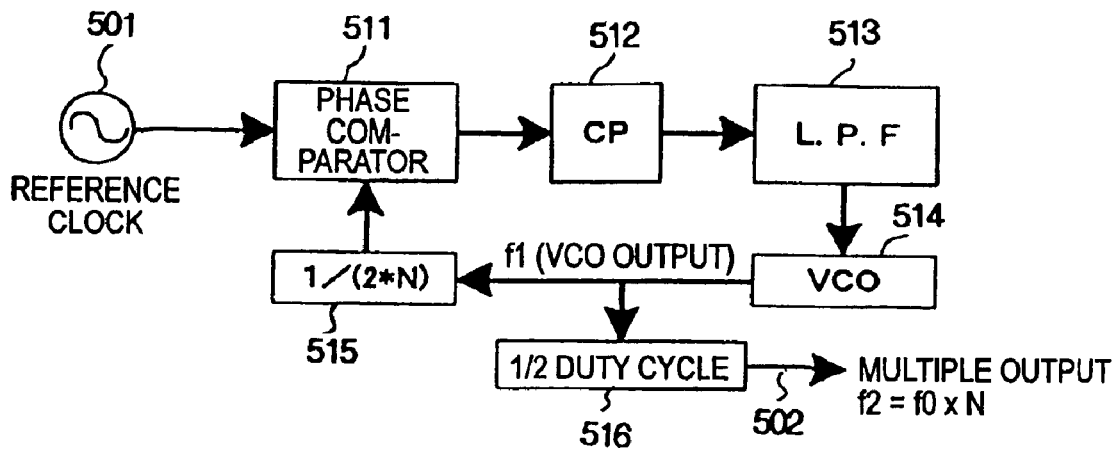
FIG. 5 is a block diagram showing the configuration of a related art clock multiplier circuit using a PLL.
Figure 6:
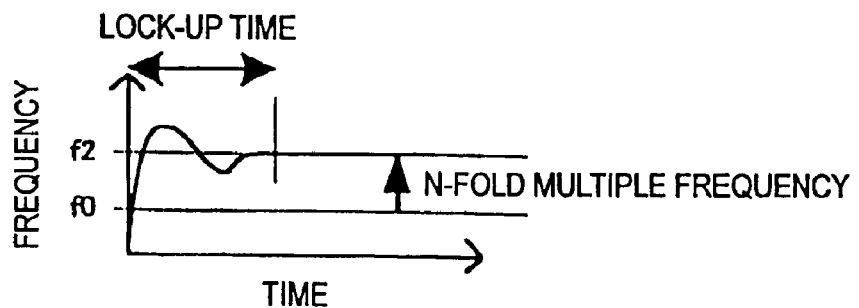
FIG. 6 shows the transition in the output frequency of a related art clock multiplier circuit using a PLL at the start of operation of the output frequency.

FIG. 4 is a timing chart illustrating the operation of the clock multiplier circuit of the above configuration. Operation of the clock multiplier circuit of the invention will be described referring to FIGS. 1 through 4. For ease of description, it is assumed that the oscillating frequency f1 of the ring oscillator 111 is about 20 MHz, the frequency f0 of the reference clock 101 as 1 MHz, the frequency f2 of the multiple clock 102 is 2 MHz, that is, the multiplication factor N equals 2.

In the reference clock counter 112, the reference clock 101 is sampled by using the output clock f1 of the ring oscillator 111 and the sampling pulses up to inversion of the reference clock 101 are counted to obtain the sampling value M of a half cycle of the reference clock 101 which equals 10.

In the sampling operation, the variation point of the reference clock 101 is seized in synchronization of the output clock of the ring oscillator 111 in order to avoid a hazard. For example, the variation point of the reference clock 101 is seized on the trailing edge of the output clock of the ring oscillator 111 and the reference clock counter 112 is operated on the leading edge thereof.

The multiplication factor setting circuit 113 calculates the multiple count value M/N=5 from the sampling value M of a half cycle of the reference clock 101 which equals 10 and the multiplication factor N=2 given by an input of multiplication factor. The latest value of the multiple count value M/N is input to the multiple clock counter 114 at any time.

The multiple clock counter 114 samples the reference clock 101 with the output clock f1 of the ring oscillator 111 to seize the variation point where the reference clock 101 is inverted, and counts the output clock f1 starting from the variation point and inverting the output each time the count reaches the multiple count value M/N, thereby generating the multiple clock 102 having a half cycle 1/N times that of the reference clock, that is, a frequency f2 N times the frequency f1 of the reference clock.

In the sampling operation, same as the case of the reference clock counter 112, the variation point of the reference clock 101 is seized in synchronization of the output clock of the ring oscillator 111 in order to avoid a hazard. For example, the variation point of the reference clock 101 is seized on the trailing edge of the output clock of the ring oscillator 111 and the multiple clock counter 114 is operated on the leading edge thereof.

A pulse S1 output in each cycle of the reference clock 101 is supplied to the unlock detection circuit 115. From the multiple clock counter 114, a count end pulse S2 indicating that counting is complete up to the multiple count value M/N is supplied to the unlock detection circuit 115. In case the count end pulse is not generated per reference clock, this phenomenon is detected as an unlock.

The unlock detection circuit 115 comprises, for example, a flip-flop set with the pulse S1 and reset with the count end pulse S2. In case the flip-flop is set when the pulse is input, this phenomenon is readily detected as an unlock.

The resetting circuit 116, in response to a variation in the output of the unlock detection circuit 115, generates a reset pulse S4 and applies the reset pulse. S4 to the ring oscillator 111 in order to restart the ring oscillator 111. Resetting of the clock multiplier circuit is enabled in case the unlock is caused by shutdown of the ring oscillator.

In the above operation, the reference clock counter 112 uses the output clock of the ring oscillator 111 to seize the variation point of the reference clock 101 to acquire the half-cycle sampling value M. The multiple clock counter 114 uses the same output clock of the ring oscillator 111 to count up to the multiple count value M/N. Even in case the oscillating frequency of the ring oscillator 111 varies, correction according to the variation is automatically performed.

This operation will be described referring to FIG. 4. At time t1, the sampling value M=10 is obtained. The multiple count value M/N=5 is calculated. The multiple clock 102 (f2) is inverted per five pulses of the output clock f1 of the ring oscillator. At time t2, the oscillating frequency f1 of the ring oscillator 111 varies and the sampling value M=7 is obtained. Thus the multiple count value M/N=3 is calculated. The multiple clock 102 (f2) is inverted per three pulses of the output clock f1 of the ring oscillator. The last half cycle shows a waveform containing a phase error.

The multiple clock counter 114 counts the output clock f1 of the ring oscillator, starting from the variation point of the reference clock 101 so as to align the phase of the generated multiple clock 102 with that of the reference clock 101. This approach is not a direct phase synchronization, so that accuracy per multiple clock pulse is lower than that of a PLL. However, it is possible to align the time per reference clock cycle and readily generate a phase-synchronized N-fold multiple clock.

As mentioned hereabove, according to the invention, by generating a multiple clock in a circuit which counts a multiple count value, analog devices in the circuit are eliminated. This scales down an LSI chip in the circuit and provides a clock multiple circuit without a feedback loop, thereby obtaining an output free from a transient response observed in a PLL.

According to the invention, the count value of a half cycle of the reference clock is obtained by using the output clock of a free-run ring oscillator. A multiple clock is generated by counting a multiple count value through use of the same output clock of the ring oscillator. Thus, even in case the oscillating frequency of the ring oscillator varies due to a variation in the source voltage or temperature, correction according to the variation is automatically performed.

According to the invention, the ring oscillator comprises an off number of inverter stages. The resulting circuit design is easier than a circuit using analog devices so that it is not necessary to use the oscillating frequency control voltage range (dynamic range) required in case a VCO is used. This readily reduces the voltage of the circuit.

According to the invention, counting to generate a multiple clock is started in synchronization with the inversion per half cycle of the reference clock. Thus it is possible to align the phase of the multiple clock with that of the reference clock without using a phase comparator.

According to the invention, by determining detection of an unlock in case a count end pulse is not detected within a cycle of the reference clock, it is possible to detect a case where a multiple clock is not obtained because the ring oscillator is shut down. By restarting the ring oscillator based on the determination of detection of an unlock, it is possible to automatically reset the operation of the clock multiplier circuit.

What is claimed is:

1. A clock multiplier circuit which outputs a multiple clock having a frequency of a multiplication factor externally given with regard to a reference clock, comprising:

a ring oscillator which oscillates at a higher frequency than that of said multiple clock;

a reference clock counter for counting the sampling output of the reference clock by the output clock of the ring oscillator to obtain a count value of the half cycle of the reference clock; and a multiple clock counter which, in case the value obtained by dividing the count value of the half cycle of said reference clock by said multiplication factor is defined as a multiple count value, inverts the multiple clock output each time it counts said multiple count value by the output clock of said ring oscillator.

2. A clock multiplier circuit according to claim 1, wherein said ring oscillator comprises an odd number of inverter stages.

3. A clock multiplier circuit according to claim 1 or 2, wherein said multiple clock counter starts counting of a multiple count value in synchronization with the inversion per half cycle of said reference clock.

4. A clock multiplier circuit according any one of claims 1 through 3, further comprising:

an unlock detection circuit;

wherein said multiple clock counter generates a count end pulse each time it counts said multiple count value and that said unlock detection circuit determines detection of an unlock in case said count end pulse is not detected within a cycle of said reference clock and restarts said ring oscillator based on determination of said detection of unlock.

* * * * *